United States Patent
Ouyang et al.

(10) Patent No.: US 9,720,061 B2
(45) Date of Patent: Aug. 1, 2017

(54) SYSTEMS, METHODS AND GUI FOR CHEMICAL EXCHANGE SATURATION TRANSFER (CEST) ANALYSIS

(71) Applicant: Toshiba Medical Systems Corporation, Tochigi (JP)

(72) Inventors: Cheng Ouyang, Buffalo Grove, IL (US); Xiangzhi Zhou, Vernon Hills, IL (US); Mitsue Miyazaki, Des Plaines, IL (US)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 512 days.

(21) Appl. No.: 14/490,793

(22) Filed: Sep. 19, 2014

(65) Prior Publication Data

US 2016/0084928 A1    Mar. 24, 2016

(51) Int. Cl.
| | |
|---|---|
| *G01V 3/00* | (2006.01) |
| *G01R 33/56* | (2006.01) |
| *G01R 33/48* | (2006.01) |
| *G01R 33/54* | (2006.01) |

(52) U.S. Cl.
CPC ...... *G01R 33/5605* (2013.01); *G01R 33/4828* (2013.01); *G01R 33/546* (2013.01)

(58) Field of Classification Search
USPC ........................................................ 324/318
See application file for complete search history.

(56) References Cited

U.S. PATENT DOCUMENTS

| | | | |
|---|---|---|---|
| 5,557,202 A | 9/1996 | Miyazaki et al. | |
| 2010/0286502 A1* | 11/2010 | Van Zijl | G01R 33/483 600/410 |
| 2013/0166226 A1* | 6/2013 | Lee | G01R 33/5605 702/30 |
| 2014/0062473 A1* | 3/2014 | Miyazaki | G01R 33/50 324/308 |
| 2014/0062476 A1* | 3/2014 | Miyazaki | G01R 33/341 324/309 |
| 2014/0361776 A1* | 12/2014 | Miyazaki | G01R 33/5605 324/322 |
| 2015/0219735 A1* | 8/2015 | Miyazaki | G01R 33/5605 324/309 |
| 2016/0061921 A1* | 3/2016 | Katscher | G01R 33/48 324/309 |

OTHER PUBLICATIONS

Wolff et al., "Magnetization Transfer Contrast (MTC) and Tissue Water Proton Relaxation in Vivo", Magnetic Resonance in Medicine 10, 135-144 (1989).

M. van Zijl et al., "Chemical Exchange Saturation Transfer (CEST): What is in a Name and What Isn't?", Magnetic Resonance in Medicine 65:927-948 (2011).

\* cited by examiner

*Primary Examiner* — Rodney Fuller

(74) *Attorney, Agent, or Firm* — Nixon & Vanderhye P.C.

(57) ABSTRACT

Chemical exchange saturation transfer (CEST) effects are enhanced by forming, for each of a plurality of magnetization transfer (MT) offset frequencies within a specified first range, a respective image representing CEST effects. A subset of the formed CEST images is displayed and a preferred or optimum one is selected from a display screen. The thus identified target frequency is then used to generate a composite enhanced CEST image based upon a combination of formed CEST images having MT frequencies within a specified second, smaller range, around the identified target frequency.

18 Claims, 7 Drawing Sheets

SYSTEMS, METHODS AND GUI FOR CHEMICAL EXCHANGE SATURATION TRANSFER (CEST) ANALYSIS

FIELD

The subject matter below relates generally to magnetic resonance imaging (MRI), and more particularly to systems, methods, and computer readable storage medium configured for improving the analysis of chemical exchange saturation transfer (CEST) effects in MRI.

DETAILED DESCRIPTION

Figure 1:
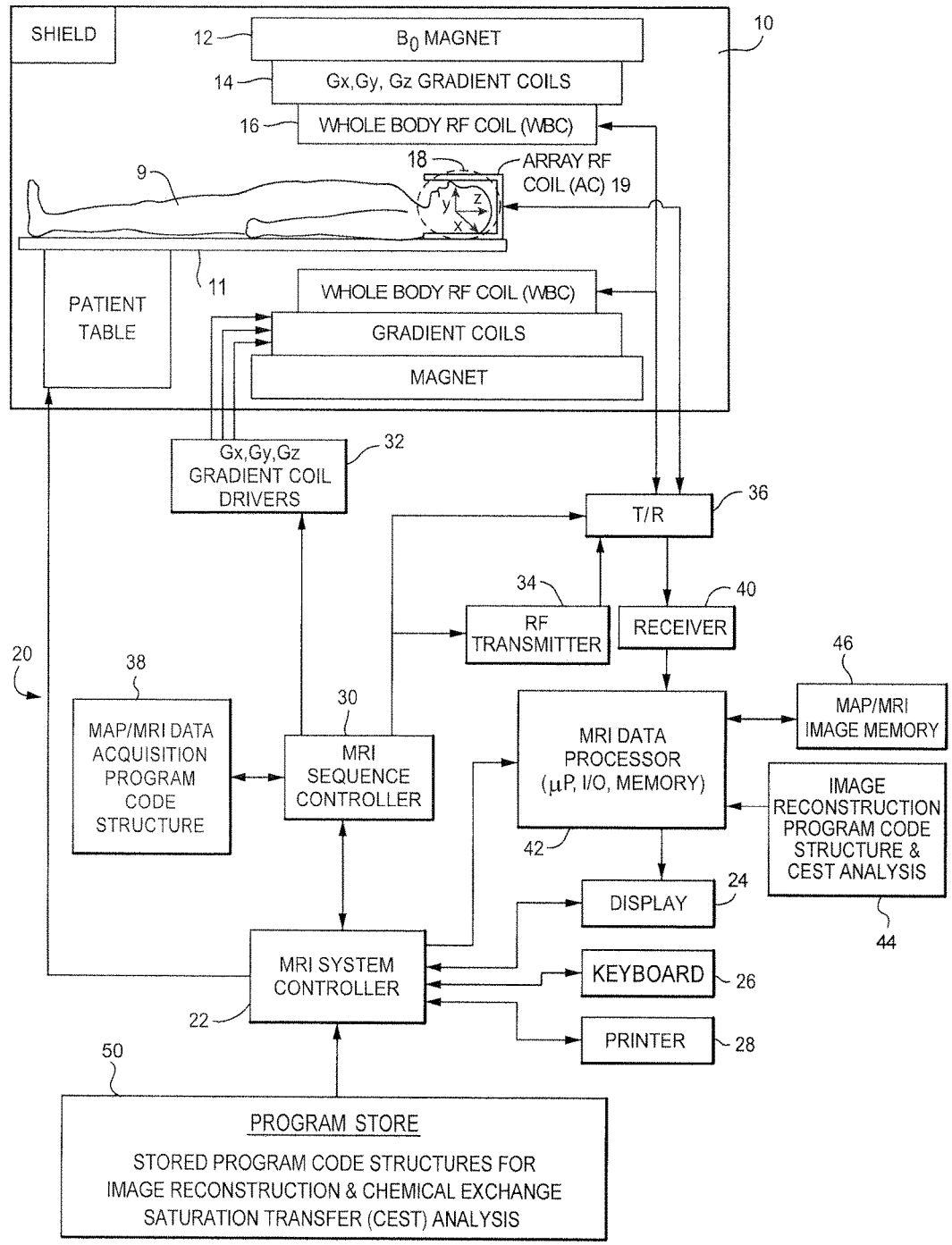
FIG. 1 is a high-level schematic block diagram of an MRI system, in accordance with one or more embodiments.

The MRI system shown in FIG. 1 includes a gantry 10 (shown in schematic cross-section) and various related system components 20 interfaced therewith. At least the gantry 10 is typically located in a shielded room. The MRI system geometry depicted in FIG. 1 includes a substantially coaxial cylindrical arrangement of the static field $B_0$ magnet 12, a Gx, Gy and Gz gradient coil set 14 and a large whole body radio frequency (RF) coil (WBC) assembly 16. Along the horizontal axis of this cylindrical array of elements is an imaging volume 18 shown as substantially encompassing a portion of the body of patient 9 supported by a patient table 11. A smaller array RF coil (AC) 19 might be coupled to a portion of the patient. The part of patient 9 that is subject to scanning using RF coil 19 is referred to herein, for example, as "scanned object" or "object" in imaging volume 18. As those in the art will appreciate, compared to the WBC (whole body coil), relatively small coils and/or arrays such as surface coils or the like are often customized for particular body parts (e.g., arms, shoulders, elbows, wrists, knees, legs, chest, spine, etc.). Such smaller RF coils are herein referred to as array coils (AC) or phased array coils (PAC). These may include at least one coil configured to transmit RF signals into the imaging volume and one or more receiver coils configured to receive RF signals from an object, such as the part of the patient body in the example above, in the imaging volume.

An MRI system controller 22 has input/output ports connected to a display 24, keyboard 26 and printer 28. As will be appreciated, the display 24 may be of the touch-screen variety so that it provides control inputs as well.

The MRI system controller 22, or a computer coupled to the MRI system controller 22, may be operated to provide the MRI sequence controller 30 with information about a pulse sequence and/or to manage the operations of the entire system, according to installed software programs. The MRI system controller 22 may also serve as an element for instructing a patient to perform tasks, such as, for example, a breath hold by a voice massage produced using an automatic voice synthesis technique.

The MRI system controller 22 interfaces with MRI sequence controller 30 which, in turn, controls the Gx, Gy and Gz gradient coil drivers 32, as well as the RF transmitter 34 and the transmit/receive switch 36 (if the same RF coil is used for both transmission and reception). The MRI sequence controller 30 includes suitable program code structure 38 for implementing MRI imaging (also known as nuclear magnetic resonance, or NMR, imaging) techniques. The MRI imaging techniques may include, for example, parallel imaging and/or other imaging sequences.

The pulse-sequence information includes information required for operating the Gx, Gy and Gz gradient coil drivers 32, as well as the RF transmitter 34 and the transmit/receive switch 36 (if the same RF coil is used for both transmission and reception) according to a pulse sequence. Such information includes the strength, duration, and application timing of pulsed currents applied to the x-, y-, and z-coil.

The MRI system 20 includes an RF receiver 40 providing input to data processor 42 so as to create processed image data, which is sent to display 24. The MRI data processor 42 is also configured for access to system configuration parameters 46 and MRI image reconstruction program code structures 44 and 50. MRI image reconstruction program code structures 44 and 50 may, in addition to control logic for reconstructing MRI images, also include control logic to obtain MR data from RF coils 16 and/or 19. The MRI data processor 42 also operates to execute methods, such as, method 300 shown in FIG. 3 or parts thereof to obtain images utilizing enhanced CEST effects.

Although shown in FIG. 1 as being located away from the RF coils 16 and 19, in some embodiments, any of RF transmitter 34, transmit/receive switch 36, and RF receiver 40 may be located in close proximity to, or on a surface of, either or both RF coils 16 and 19.

Also illustrated in FIG. 1 is a generalized depiction of an MRI system program store 50 where stored program code structures (e.g., for image reconstruction, for defining graphical user interfaces (GUI) and accepting operator inputs to same, etc.) are stored in non-transitory computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22). As those in the art will also appreciate, configuration of computer control circuits can be effected not only by stored computer program code structures (sometimes called software or firmware) which provide instructions for execution in a central processing unit (CPU) of one or more computers. Computer control circuits may also be configured as application specific integrated circuits (ASICs) or programmed gate arrays (PGAs) and otherwise.

Indeed, as those in the art will appreciate, the FIG. 1 depiction is a very high-level simplified diagram of a typical MRI system with some modifications so as to practice exemplary embodiments described hereinbelow. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes a coil sensitivity map generation process, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaging volume space). As those in the art will appreciate, such arrays of stored data values represent and also constitute a physical structure - as does a particular structure of computer control program codes that, when sequentially loaded into instruction registers and executed by one or more CPUs of the MRI system 20, causes a particular sequence of operational states to occur and be transitioned through within the MRI system.

Example embodiments described herein may be applicable for MR imaging of any object in which CEST effects (effected using magnetization transfer (MT) pulses) are used for diagnosis or other uses. During the scanning process, with the object located in the MRI gantry, one or more RF coils, such as whole body coil 16 and/or array, coil 19, may transmit RF pulses to selected parts of the object in order to excite nuclear magnetic resonance (NMR) spins in particular parts of the object. For example, array coil 19, which is placed in the example at an area of the patient's body, may be used to excite nuclear spins specifically in that area. Subsequently, MR signals (e.g. echo signals) which are generated as a result of the earlier excitation are received by one or more RF receiver coils. The transmitting of the RF pulses and the receiving of the MR signals may be done using the same RF coil (e.g. RF coil 19 configured for both transmit RF excitation pulses and receive corresponding MR signals) or by different RF coils (e.g. WBC 16 is configured to transmit RF pulses and RF coil 19 is configured to receive corresponding MR signals). In order to generate MRI images that are used for diagnostic or other purposes, data corresponding to the received MR signals must be communicated to a control system, such as a processing system including MRI data processor 42, for processing.

MT effects (or what may be referred to as MTC—magnetization transfer contrast—effects) are used, for example, to produce images that utilize image contrast between blood (e.g., flow of blood) and tissue in applications such as, but not limited to, MR angiography (MRA). MT effects are based on chemical exchanges and/or cross relaxation between NMR protons (e.g. hydrogen nuclei) of multiple types of nuclear pools, such as free water (also referred to as bulk water) and various macromolecules. Each of the multiple types of nuclear pools may have protons that are bound differently and have different Larmor frequencies than protons in the other nuclear pools.

An "MT pulse" is an RF pulse that causes MT effects in, for example, free water and macromolecules. When considering the resonance peak frequency $F_0$ of free water as the center frequency, a frequency-selective pulse serving as an MT pulse is applied to excite a frequency range shifted, for example, by 500 Hz from the center frequency $F_0$ of free water (that is, off-resonance excitation). This excitation causes NMR magnetization of nuclei in free water and of, if present, nuclei in selected other macromolecules, both of which are in equilibrium at the time, to change relative to one another as the net NMR magnetization of free water nuclei moves to the net magnetization of nuclei in macromolecules. As a result of the movement, the net NMR signal emanating from free water decreases. Differences in signal are caused between one region in which the MT effect chemical exchanges and/or cross relaxation between free water and macromolecules occur and another region in which the MT effect does not occur (or occurs to a substantially lesser degree). These differences are used to enhance and observe contrast between, for example, flow of blood and tissue or other areas or objects of interest.

According to some embodiments, MRI data acquisition includes applying a composite pulse sequence having (a) an MT pulse sequence and (b) an MR imaging pulse sequence. As the imaging pulse sequence in example embodiments, a two-dimensional (2D) scan or a three-dimensional (3D) scan pulse sequence can be adopted. Example, available MRI pulse sequences include an SE (spin echo) sequence, FE (field gradient echo) sequence, FSE (Fast SE) sequence, FASE (Fast asymmetric SE) sequence, and others.

MT sequence pulses are applied before the MR imaging sequence pulses. Typically, before the imaging pulse sequence (also sometimes referred to as a main sequence), a pre-sequence including RF pulses functioning as MT pulses is also applied. The pre-sequence may include gradient spoiler pulses applied to any one or more axis directions (e.g., slice, phase-encoding, and readout directions).

MT pulses may be applied slice-selectively or non-selectively. MT pulses typically are made up of RF pulses for NMR excitation which are individually formed within envelopes having a truncated sinc function shape, for example. An MT pulse may also be made up of RF pulses within an envelope in accordance with a Gaussian function. MT pulses are formed by modulating, e.g., with a sinc function, RF pulses each having a desired frequency offset. Binomial pulses, such as described in U.S. Pat. No. 5,557,202 to Miyazaki et al, which is hereby incorporated in its entirety by reference, may also be used as MT pulses. The number of MT pulses applied in a sequence of pulses during an imaging cycle is a number, such as, for example, 10 pulses or 40 pulses.

The application of MT pulses to an area of an object being scanned causes MT effects between bound protons nutating at a selected frequency and free water protons in that area. The MT effect causes a signal from the selected bound protons to decrease by an amount larger than that of free water protons, thereby increasing contrast between corresponding areas in the resulting image.

Chemical exchange saturation transfer (CEST) is another technique, similar to MTC, for improving contrast in MRI. In imaging with CEST effects, selective RF irradiation of exchangeable protons in macromolecules, such as amide (—NH), hydroxyl (—OH), and amine (—NH2), is detected through progressive saturation of the water signal consequent to chemical exchange. In CEST, transfer of magnetization is observed in mobile compounds of the above protons instead of semisolids for which MTC is used. Similar to MTC, CEST has contributions of both chemical exchange and dipolar cross-relaxation, but the latter can often be neglected if exchange is fast. Contrary to MTC, CEST imaging requires sufficiently slow exchange on the MR time scale to enable selective irradiation of the protons of interest. (Peter C. M. van Zijl et al, "Chemical Exchange Saturation Transfer (CEST): What is in a Name and What Isn't?," MRM, 65:927-948 (2011)).

As discussed above, the MT effect and the CEST effect can be triggered by saturating exchangeable macromolecule protons that resonate at a frequency different from free water protons, and having that saturation transferred to the free water protons when the solute protons exchange with free water protons. The free water signal is attenuated due to the transfer. However, because the water pool is generally much larger than the macromolecule pool, for the attenuation of the water signal due to the MT effect/CEST effect to be visible, the saturation typically should be performed for a long duration (around 1-3 seconds) using more than a single pulse, and possibly, a plurality of pulses such as, for example, a sequence of 40 MT-pulses.

The efficiency of the MT effect and/or CEST effect is typically expressed in terms of a signal or magnetization reduction due to the resulting MT effect or CEST effect. The frequency-dependent saturation effects caused by CEST effects may be visualized by plotting the water saturation normalized by the signal without saturation as a function of saturation frequency. This yields a "Z-spectrum" (see FIG. 2C). The Z-spectrum is characterized by symmetric direct saturation around the water frequency $F_0$ (in other words, the Z-spectrum is illustrated with 0 ppm (parts per million) assigned to the water frequency).

For each application of a selected frequency in the CEST spectrum, the CEST effect may be caused by elevating signals of hydroxyl, amine, and amide protons, separately. For example, the CEST effect can be obtained by irradiating the particular frequency of hydroxyl (1 ppm), amine (approximately 2 ppm) and amide protons (approximately 3.5 ppm), where the frequency in ppm values are specified relative to the free water frequency $F_0$. Conventionally MT pulses in the range of −6 ppm to +6 ppm, or a sub range thereof, may be applied in order to analyze the Z-spectra of a sample.

However, the CEST effect caused by excitation at a single frequency is relatively small. For example, in normal tissue, the effect of signal gain by CEST effect is about 2-3% for the normal tissue at a particular frequency.

Peter C. M. van Zijl et al, "Chemical Exchange Saturation Transfer (CEST): What is in a Name and What Isn't?," MRM, 65:927-948 (2011), in FIG. 1 (hereinafter "the van Zijl figure"), illustrates an example of the CEST process and related proton signal, Z-spectrum and asymmetric magnetization transfer (MTRasym) spectrum.

The van Zijl figure in part (a) illustrates the basic CEST exchange in a sample between a smaller pool of macromolecule protons (left, "solute protons") and a larger pool of free water protons (right, "water protons"). The van Zijl figure in part (b)illustrates the proton signal from the sample before (left, "$S_0$") and after (right, "$S_{sat}$") the saturation transfer where the H-spectra in which the standard NMR chemical shift assignment for water is typically shown at 4.75 ppm. In this example, solute protons (amide protons in this example) are saturated at their resonant frequency of 8.25 ppm. This saturation is subsequently transferred to water at a rate $k_{sw}$ and non-saturated protons from water are transferred to the solute pool at a rate $k_{ws}$. After some time period $t_{sat}$, the net effect of the saturation transfer becomes visible in the water signal; the heightened signal at 8.25 ppm evident in the signal $S_0$ before saturation is no longer visible in the signal $S_{sat}$ after saturation (i.e., a blip is visible at 8.25 ppm in $S_0$ in FIG. 2B, but does not exist at 8.25 ppm in $S_{sat}$).

The van Zijl figure in part (c) illustrates the Z-spectra (sometimes referred to as CEST spectra). As shown, the Z-spectra is obtained by plotting the normalized water saturation $S_{sat}/S_0$ as a function of the irradiation frequency. With the Z-spectra, the resonant frequency of free water is represented as 0 ppm, and the representation of the resonant frequencies of molecules are correspondingly adjusted to indicate their values as an offset from the water frequency of 0 ppm. For example, the frequency of amide which is represented as 8.75 ppm in the H-spectrum when water is represented as 4.75 ppm, is, in the Z-spectra, represented as 3.5 ppm. The van Zijl figure in part (d) illustrates the result of the magnetization transfer ratio (MTR=1−$S_{sat}/S_0$) asymmetry analysis of the Z-spectrum with respect to the water frequency to remove the effect of direct saturation (e.g. to remove the effect of the water signal). The effect of direct saturation is removed by subtracting the saturated signal at a positive offset frequency from the water frequency, from the saturated signal at a negative offset from the water frequency. Thus, the MTRasym spectrum is obtained by $(S_{sat}(-\Delta\omega)-S_{sat}(\Delta\omega))/S_0$, $\Delta\omega$ being the frequency difference of the solute protons with water. The signal shown in the van Zijl figure in part (d), the MTRasym signal, is in effect, due to the blip visible at 8.25 ppm of the $S_0$ signal shown in the van Zijl figure in part (b). A "CEST image" is a representation of the MTRasym signal.

However, in conventional systems, MTRasym spectra often show mixed effects of amine, amide and hydroxyl protons. The mixing of the effects of these different protons hinders depiction of the CEST effect caused by a particular type or group of types of protons, thereby hindering accurate diagnosis. Basically, in conventional systems, CEST images show not only irregularity of the diseased area, but also elsewhere. Effects of neighboring signals like amide (at 3.5 ppm), amine (at 2 ppm) and/or hydroxyl (at 1 ppm), obscure the resolved data.

Embodiments disclosed herein enable one to more clearly identify the CEST effect due to a particular type of proton. According to some embodiments, MTRasym spectra are processed and used as described in relation to FIG. 2 in order to output an enhanced CEST image in which the CEST effect of particular protons can be clearly identified.

Figure 2:
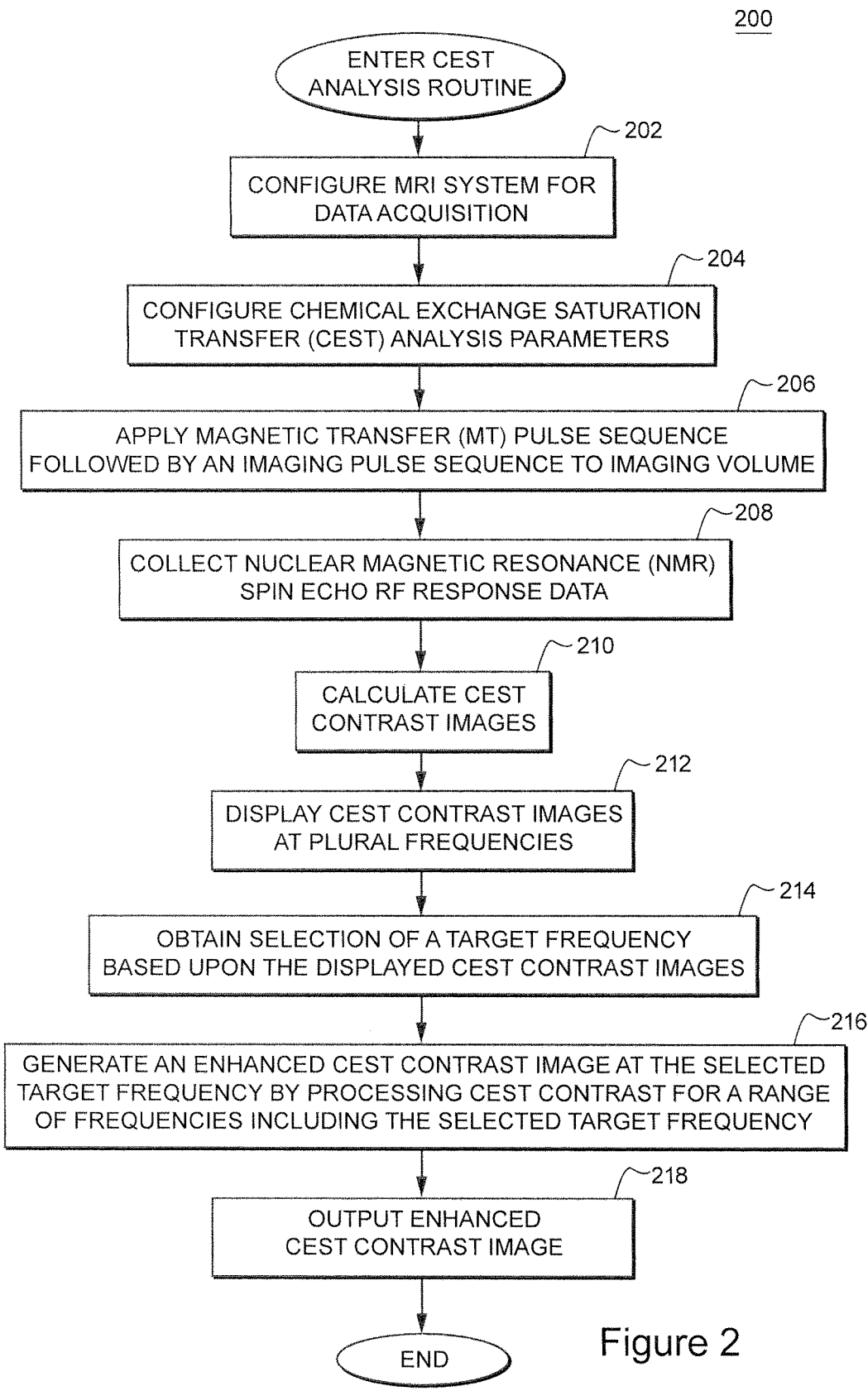
FIG. 2 illustrates a flowchart of a CEST analysis routine in accordance with one or more embodiments.

FIG. 2 illustrates a flowchart of a process 200 for enhancing the CEST effect, according to one or more embodiments. Operations 202-218 may be performed and/or controlled by MRI data processor 42, MRI system controller 22, and/or MRI sequence controller 30 shown in FIG. 1.

After entry to the CEST analysis routine, at operation 202, the object under analysis (e.g., patient) and the MRI system are prepared for scanning. Preparation may include selecting a pulse sequence to be applied to the object. The selected pulse sequence includes an MT pulse sequence to be applied before an MR imaging pulse sequence. In some embodiments, the desired composite pulse sequence may be selected from a plurality of pre-stored composite pulse sequences. Some embodiments provide for the user to specify the pulse sequence or to modify parts of a pre-stored pulse sequence.

At operation 204, CEST analysis parameters are configured. CEST analysis parameters that may be configured, according to embodiments, may include a range of frequencies for which plural CEST images are displayed, a range over which the CEST effects are integrated (or averaged, or summed) to produce an enhanced CEST image corresponding to a target frequency, frequency intervals for acquiring CEST effect data, etc.

At operation 206, the selected (or configured) MT pulse sequence is applied to the object in the MRI gantry. According to an embodiment, the MT pulse sequence, each pulse therein having about 100 ms duration, is continuously transmitted for about 2 seconds. As those in the art will appreciate, the number of MT pulses, their durations, sequence and period of transmission may be adjusted as desired or needed for a particular situation. Following the MT pulse sequence, an MR imaging pulse sequence is applied to the object. The MR imaging pulse sequence may typically include one or more RF excitation pulses, such as, for example, a 90° RF excitation nutation pulse to stimulate creation of NMR spin echo RF responses.

At operation 208, NMR spin echo data responsive to the imaging pulses are collected as MR k-space data. Operations 206-208 are repeated in order to obtain NMR spin echo data for a desired frequency offset on either side of the water frequency (e.g. +6 ppm and −6 ppm). A relaxation interval, such as 6-9 seconds may be included before repetition of the pulse sequence between one offset frequency and another. Moreover, operations 206-208 may be repeated for multiple scan frequency intervals (e.g. every 0.1 ppm from a lower limit value to a higher limit value) to acquire sufficient Z-spectra data.

At operation 210, CEST contrast images are calculated. The CEST image calculation includes, for a particular frequency, the subtraction of (a) the signal resulting from a positive offset from that particular frequency and (b) the signal resulting from a negative offset from the same particular frequency. The calculated CEST images include enhancements in contrast due to CEST effects, thereby yielding an MRI image in the spatial domain with improved contrast in certain areas affected by MT effects and/or CEST effects.

According to some embodiments, the CEST contrast images are calculated for a configurable range of frequencies, and at configurable frequency intervals within the range. An example embodiment may calculate CEST images for frequencies within a range from 1 ppm to 6 ppm, at each 0.1 ppm increment within that range (e.g., CEST images at 1, 1.1, 1.2, 1.3 . . . 5.8, 5.9, 6 ppm). The calculated CEST images may be stored in a memory for subsequent access and use.

Figure 3:
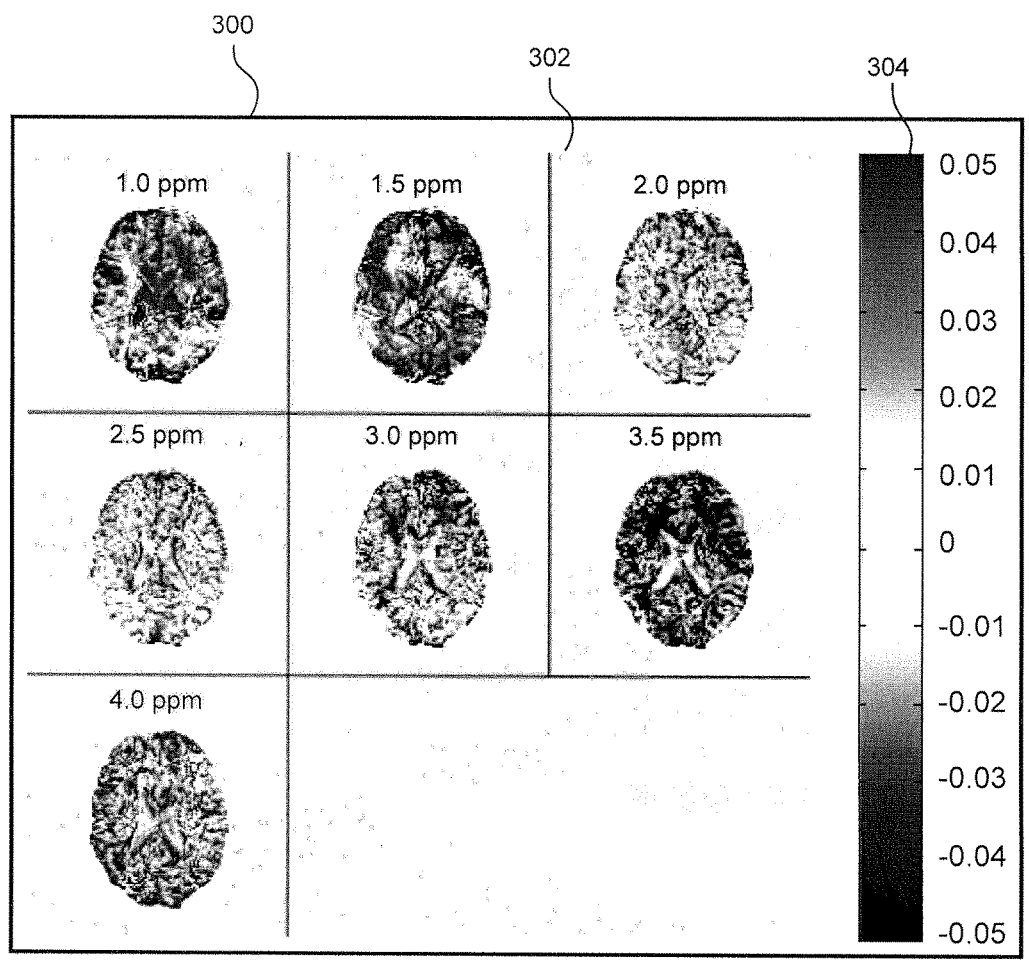
FIG. 3 is screenshot of a display screen in which plural CEST maps are displayed for respective frequencies within a specified range of frequencies, in accordance with one or more embodiments.

At operation 212, a plurality of the resulting CEST images 302 are displayed to the user. The plurality of displayed resulting CEST images may be selected as those (within displayed contrast range 304) at regular configurable intervals within a configured frequency range. For example, CEST images between 1 ppm and 4.5 ppm at every 0.5 ppm may be displayed as shown in FIG. 3. The range of frequencies for which CEST images are displayed, and the frequency interval between CEST images selected for display, may be configurable. The range for which CEST images are displayed may be a sub-range (e.g., 1-4 ppm at 0.5 ppm intervals) of the larger overall range, described above (e.g., 1-6 ppm at 0.1 ppm intervals) in relation to operation 210, for calculating CEST images. The display of CEST images, configuration related to the display etc., may use a GUI such as that shown, for example, in FIGS. 4-6.

At operation 214, a target frequency is identified. A target frequency may be identified based upon a user input, such as, for example, a selection by the user of one of the displayed CEST images 302. According to an embodiment, the user may visually analyze the displayed plurality of CEST images to identify the image with the best CEST contrast (e.g. the image with maximum CEST effects) and the corresponding frequency then may be selected and identified as a desired target frequency. For example, in FIG. 3, the user may identify the CEST image corresponding to 3.5 ppm (the image on the right in the second row) as the image with the best CEST contrast.

At operation 216, an enhanced CEST contrast output image is generated. According to an embodiment, the CEST contrast images for frequencies in a range including the target frequency (e.g., from 3.0 to 4.0 ppm in 0.1 ppm intervals) are averaged together (e.g., pixel by pixel) to determine an enhanced output contrast image. According to another embodiment, the CEST contrast' images for frequencies in a specified range including the target frequency are summed together (e.g., pixel by pixel) to determine an enhanced output image. In yet another embodiment, an enhanced output image is determined based upon an integral of CEST images (e.g., again calculated on pixel by pixel basis) for the frequencies in the specified range including the target frequency.

At operation 218, the generated enhanced output CEST contrast image is output. The enhanced CEST image may be output to a GUI, another display and/or other output device such as a printer. In some embodiments, the image may be output to a memory for further processing or transmitted to a remote location.

FIG. 3 is screenshot of a display in which plural CEST maps are displayed for respective different offset frequencies within a specified range of offset frequencies, in accordance with one or more embodiments.

In the example display screen 302, seven CEST images ranging from 1 ppm to 4 ppm are simultaneously displayed. An image is displayed for each 0.5 ppm frequency interval within the range (even though data may have been acquired or interpolated at lesser, e.g., 0.1 ppm intervals). Thus, in the top row, from the left, CEST images for 1 ppm, 1.5 ppm, and 2 ppm are displayed. In the second row, from left to right, images for 2:5 ppm, 3 ppm, and 3.5 ppm are displayed. In the bottom row an image for 4 ppm is displayed.

According to some embodiments, the CEST images are displayed in color in display screen 302, and a guide band 304 which conveniently provides a visual guide as to how the various colors correspond to signal level (i.e. signal strength). In CEST images, the signal level corresponds to the level of contrast.

By simultaneously displaying a plurality of CEST images (e.g., at relatively larger intervals than that of an entire acquired data set) on a single screen, embodiments provide the capability for the user (e.g.

operator) to quickly identify an image with what appears to be peak contrast, with improved accuracy and in shorter time. The corresponding offset frequency of the selected image identified by the user as the image with the peak signal may be determined as a best "target" frequency for generating an enhanced CEST output image (which then may be generated as a combination of CEST image data within a specified range at smaller offsets from the target frequency so as to better ensure that the actual optimum CEST data set is used in the final output CEST image).

Moreover, the display of CEST images at plural offset frequencies yield other advantages such as enabling the operator to compare areas of interest in amide dominated CEST and in amine dominated CEST. For example, in FIG. 3, a comparison of the CEST images for amine at 2 ppm and amide at 3.5 ppm enables clinical differentiation between an amide-dominated or amine-dominated tumor for clinical assistance.

Figure 4:
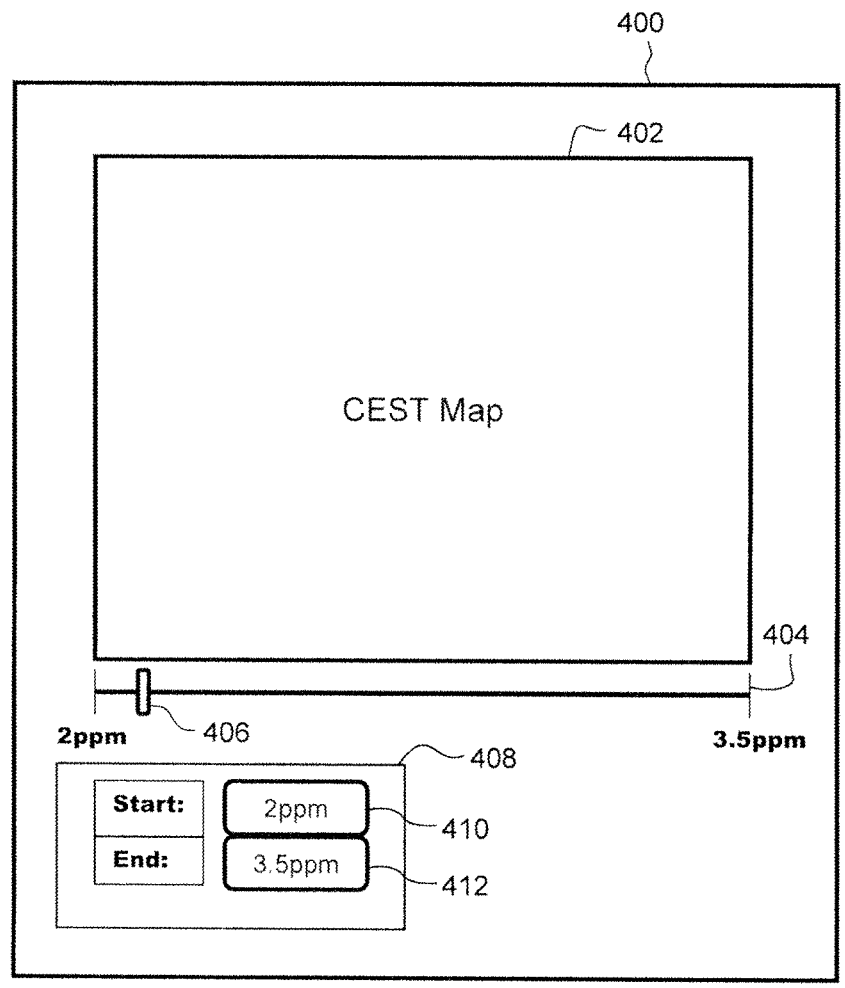
FIG. 4 is a schematic of a graphical user interface (GUI) for displaying CEST images in accordance with one or more embodiments.

FIG. 4 is a schematic of a graphical user interface (GUI) 400 for displaying CEST images, in accordance with one or more embodiments. GUI 400 includes an area 402 to display CEST images and control tools to control the displayed CEST images.

Control tools may include a scroll bar 404 ranging from a beginning frequency to an ending frequency, and a slider 406 which can be moved to any point between the indicator for the starting frequency and the indicator for the ending frequency by the user. In the shown example embodiment, the slider 406 is movable along scroll bar 404 to choose a frequency between (and, in some embodiments, including) start and stop frequencies of 2 ppm and 3.5 ppm.

In some embodiments, the starting frequency and the ending frequency for the GUI 400 may also be configured. In the embodiment shown, an input area 408 enables the user to specify the desired starting frequency in a starting frequency input field 410 and to specify the desired ending frequency in an ending frequency input field 412. The values provided by the user in fields 410 and 412 may override default values that are either configured and/or automatically determined by the system. The scroll bar 404 may be automatically re-configured in accordance with the values specified in fields 410 and 412.

One of the acquired CEST images corresponding to the frequency indicated by the slider 406 may be displayed in the display area 402. Thus, by controlling the slider 406, the user may conveniently and efficiently view CEST images at respective frequencies within a specified range. As noted above, the range of frequencies too may be configured by the user.

Figure 5:
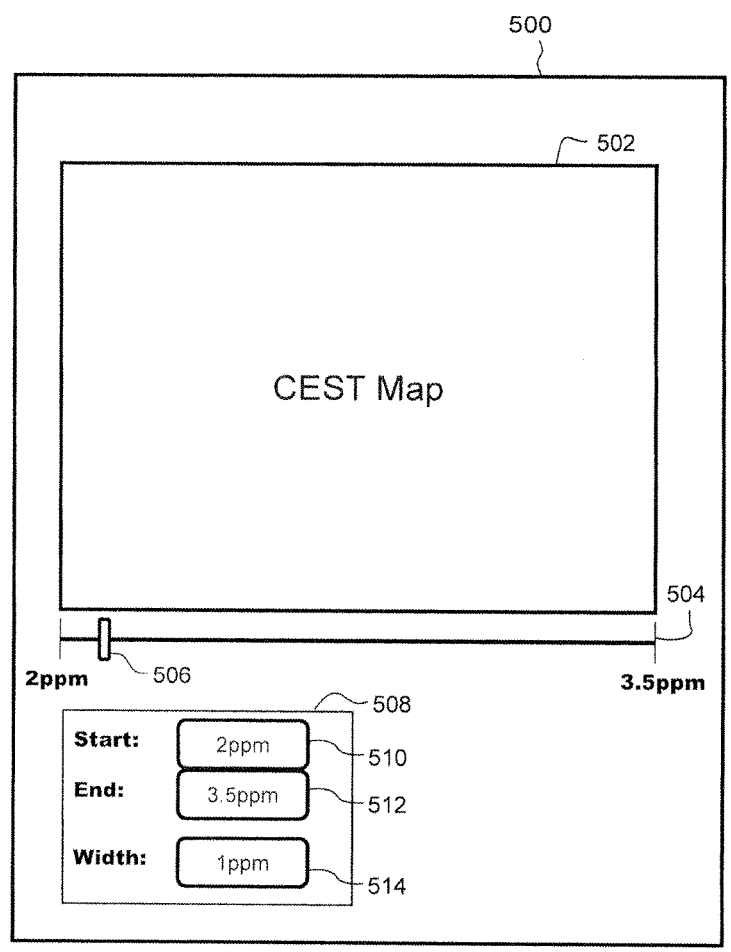
FIG. 5 is a schematic of a GUI for displaying CEST images calculated based upon a range of frequencies including a target frequency, in accordance with one or more embodiments.

FIG. 5 is a schematic of a GUI 500 for displaying CEST images acquired and calculated based upon a range of frequencies including a target frequency, in accordance with one or more embodiments. GUI 500 includes an area 502 to display CEST images and control tools to control the displayed CEST images.

Control tools may include a. scroll bar 504 ranging from a beginning frequency to an ending frequency, and a slider 506 which can be moved to any point between the indicator for the starting frequency and the indicator for the ending frequency by the user. In the shown example embodiment, the slider 506 is movable along scroll bar 504 to choose a frequency between (and, in some embodiments, including) the starting frequency and the ending frequency.

In some embodiments, the starting frequency and the ending frequency for the GUI 500 may also be configured. In the embodiment shown, an input area 508 enables the user to specify the desired starting frequency in a starting frequency input field 510 and to specify the desired ending frequency in an ending frequency input field 510. The values provided by the user in fields 510 and 512 may override default values that are either configured and/or automatically determined by the system. The scroll bar 504 may be configured in accordance with the values specified in fields 510 and 512. For example, the scroll bar 504 is configured to have a minimum at the value specified in input field 510 and to have a maximum at the value specified in input field 512.

GUI 500 may be used, in some embodiments, to display CEST images corresponding to a frequency indicated by the slider 506 that are further enhanced by calculating contrast values based upon a plurality of CEST images having corresponding frequencies in a range that includes the frequency indicated by the slider 506. GUI 500 also includes a width input field 514 via which the user can configure the range of frequencies over which the contrast values are calculated in order to determine the enhanced image. In the example shown, the user has specified 1 ppm in the width input field 514, thereby configuring the system to, when displaying an enhanced CEST image corresponding to the frequency indicated by the slider 506, determine the enhanced CEST image based upon plural CEST images that have frequencies in a range 1 ppm including the frequency indicated by the slider 506.

Thus, using the GUI 500, a user can conveniently and efficiently visually analyze composite CEST images that are enhanced by calculating the CEST effects (pixel by pixel) based upon plural images within a range that includes the current target frequency.

Figure 6:
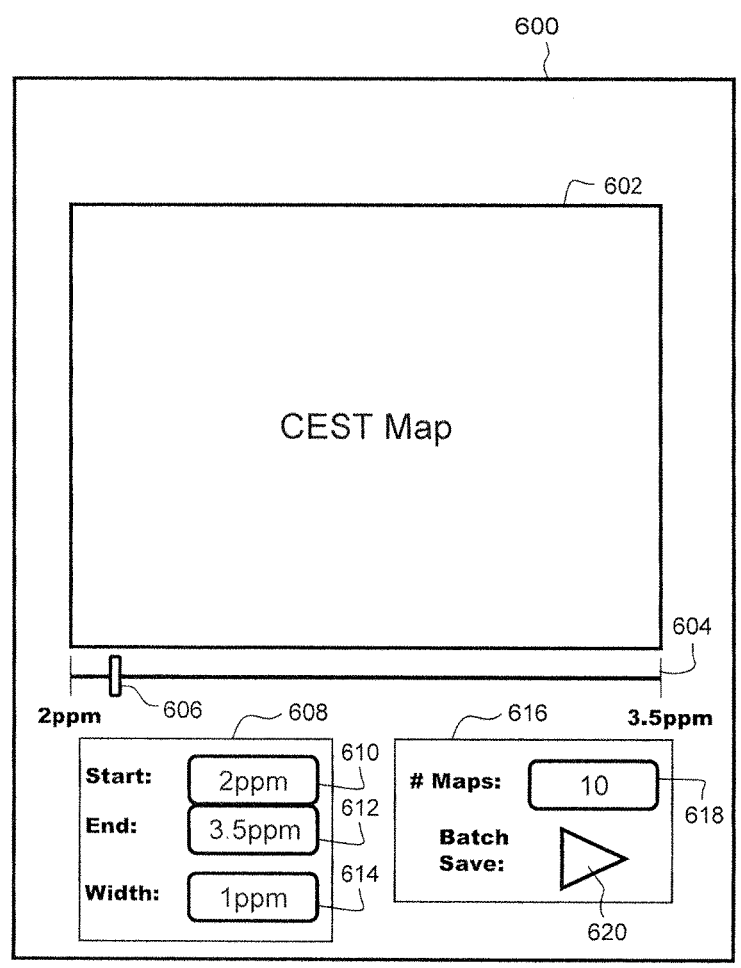
FIG. 6 is a schematic of a GUI for generating and/or displaying plural CEST images and for saving the generated images, in accordance with one or more embodiments.

FIG. 6 is a schematic of a GUI 600 for displaying CEST images calculated based upon a range of frequencies including a target frequency and for saving/outputting plural such images, in accordance with one or more embodiments. GUI 600 includes an area 602 to display CEST images and control tools to control the displayed CEST images.

Control tools may include a scroll bar 604 ranging from a beginning frequency to an ending frequency, and a slider 606 which can be moved to any point between the indicator for the starting frequency and the indicator for the ending frequency by the user. In the shown example embodiment, the slider 606 is movable along scroll bar 604 to choose a frequency between (and, in some embodiments, including) the starting frequency and the ending frequency.

In some embodiments, the starting frequency and the ending frequency for the GUI 600 may also be configured. In the embodiment shown, an input area 608 enables the user to specify the desired starting frequency in a starting frequency input field 610 and to specify the desired ending frequency in an ending frequency input field 610. The values provided by the user in fields 610 and 612 may override default values that are either configured and/or automatically determined by the system. The scroll bar 604 may be configured in accordance with the values specified in fields 610 and 612. For example, the scroll bar 604 is configured to have a minimum at the value specified in input field 610 and to have a maximum at the value specified in input field 612.

GUI 600 may be used, in some embodiments, to display CEST images corresponding to a frequency indicated by the slider 606 that are further enhanced by calculating contrast values based upon a plurality of CEST images having corresponding frequencies in a range that includes the frequency indicated by the slider 606. GUI 600 also includes a width input field 614 via which the user can configure the range of frequencies over which the contrast values are calculated in order to determine the enhanced image. In the example shown, the user has specified 1 ppm in the width input field 614, thereby configuring the system to, when displaying an enhanced CEST image corresponding to the frequency indicated by the slider 606, determine the enhanced CEST image based upon plural CEST images that have frequencies in a range 1 ppm including the frequency indicated by the slider 606.

GUI 600 includes a further input area 616, where the user may specify a number of maps to be generated and the user may also specify saving of the generated plural maps. The number of maps may be specified using maps input field 618. The user may indicate that a batch save is to be performed saving the generated plural maps by clicking on a control indicia 620.

GUI 600 may be particularly useful when generating reports. For example, in the example shown in FIG. 6, the user has provided configuration parameters to generate 10 (input at field 618) integrated CEST maps, starting with a CEST map at starting frequency 2 ppm (input at field 610) and ending with a CEST map at ending frequency 3.5 ppm (input at field 612). Each map will be integrated over a range of 1 ppm (input at field 614) centered at the selected frequency for the map. Thus, the 10 maps will be generated by forming an enhanced map for 2 ppm, and for each 0.15 ppm increment therefrom (e.g. 2 ppm, 2.15 ppm, 2.30 ppm, . . . ). Note that the CEST data may be acquired at a frequency step of 0.1 ppm, but in the CEST post-processing, the Z-spectra can be interpolated to a much smaller step, for example 0.01 ppm.

Figure 7:
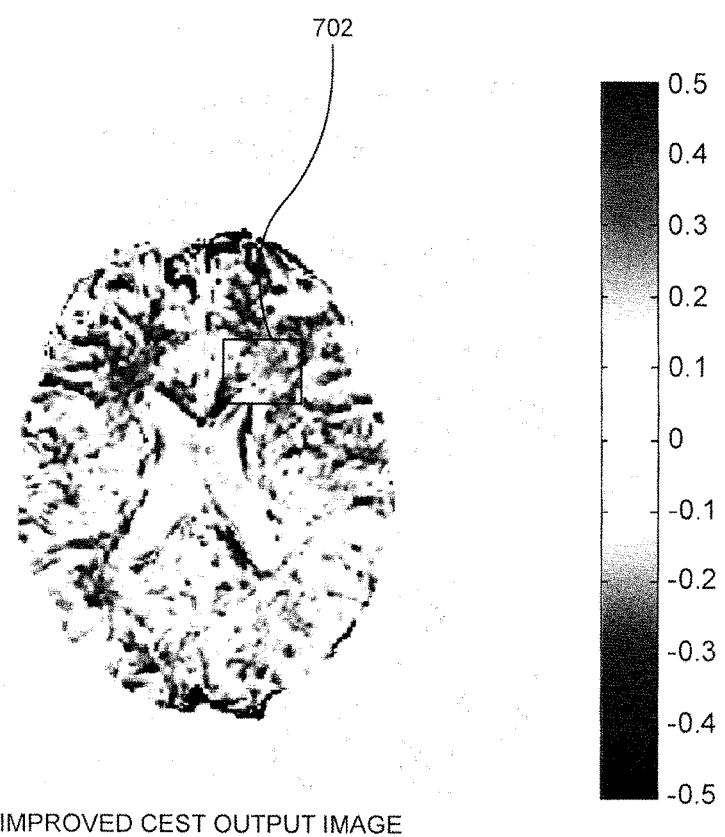
FIG. 7 illustrate a CEST image at an offset frequency of 3.5 parts per million (ppm), after applying improvements disclosed herein.

FIG. 7 illustrates a CEST image at 3.5 ppm, after applying the improvements disclosed herein.

In a clinical environment, the operator would view a screen displaying the image shown in FIG. 7 in color, with the variations in contrast marked with varying colors. The area 702 in FIG. 7 would illustrate improved CEST contrast when compared to the corresponding area in a CEST image that does not have the disclosed improvements applied. A visual comparison between CEST images of an observation area without and with the disclosed improvements is sufficient, in many cases, for quick and accurate diagnosis of the signal of interest. An enhanced signal, such as that shown in FIG. 7, can be overlaid on the source image in order facilitate easier diagnosis.

Embodiments enable the selective use of MTRasym spectra to observe a signal of interest that can subsequently be analyzed in relation to a source image to aid in diagnosis. Embodiments further enable the observation of the CEST effect at multiple frequencies like amide, amine and hydroxyl, as described above. Moreover, the CEST effect can be further enhanced by calculating an enhanced CEST image based upon a range of frequencies centered at the frequency of interest.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) system comprising:
    an MRI gantry having components including a static magnetic field coil, gradient magnetic field coils, and at least one radio frequency (RF) coil coupled to an imaging volume; and
    control circuits coupled to and controlling said gantry components to:
        (a) apply to the imaging volume a sequence of magnetization transfer (MT) pulses and at least one subsequent MR imaging sequence;
        (b) receive NMR RF responses;
        (c) form respective images representing Chemical Exchange Saturation Transfer (CEST) effects based upon the received NMR RF responses;
        (d) repeat steps (a)-(c) for each of a plurality of MT frequencies within a first range of frequencies;
        (e) display, at least one at a time, a plurality of the formed CEST images on a display screen viewable by a user;
        (f) receive user input identifying at least one of the displayed CEST images as corresponding to a target frequency based upon the MT frequency used to form the identified CEST image;
        (g) generate an enhanced output CEST image based upon a plurality of the formed CEST images acquired using MT frequencies within a specified second MT frequency range including the user-identified target frequency, said second frequency range being smaller than said first frequency range; and
        (h) output the enhanced output CEST image.

2. The MRI system according to claim 1, wherein each of the formed CEST images is based upon a respective asymmetric magnetization transfer ratio (MTRasym) determination.

3. The MRI system according to claim 1, wherein displaying a plurality of the formed CEST images on a display screen includes simultaneously displaying the plurality of the formed CEST images on the display screen.

4. The MRI system according to claim 1, wherein the displayed formed CEST images include at least formed CEST images corresponding to an amide MT frequency and amine MT frequency.

5. The MRI system according to claim 4, wherein the displayed formed CEST images further include a formed CEST image corresponding to a hydroxyl MT frequency.

6. The MRI system according to claim 1, wherein generating the enhanced CEST image includes calculating, on a pixel by pixel basis, the enhanced CEST image by at least one of: (1) an average, (2) a sum, or (3) an integral of, said formed CEST images that are within the specified second MT frequency range.

7. The MRI system according to claim 1, wherein for the specified second MT frequency range the plurality of the formed CEST images are acquired using smaller increments of MT frequency than increments of MT frequency used for the displayed plurality of formed CEST images.

8. The MRI system according to claim 1, wherein the operations further comprise providing a graphical user interface (GUI) having a map display area and one or more user controls, the one or more user controls being controllable by the user to specify one or more of the formed CEST images to be displayed on the GUI map display area.

9. The MRI system according to claim 8, wherein the one or more user controls are configurable to specify a display range of MT frequencies for which formed CEST images are displayed on the GUI map display area, said display range being within said first range, including its upper and lower limits.

10. The MRI system according to claim 8, wherein the one or more user controls are configurable to specify the second range of MT frequencies.

11. The MRI system according to claim 8, wherein the one or more user controls are configurable to specify a number of said formed CEST images to be saved in a batch mode.

12. The MRI system according to claim 8, wherein outputting the enhanced CEST image includes overlaying the enhanced CEST image onto a source image of a same patient anatomy.

13. A magnetic resonance imaging (MRI) method for use in an MRI system, said method comprising:
  (a) applying, to an imaging volume in a gantry of the MRI system, a sequence of magnetization transfer (MT) pulses and at least one subsequent MR imaging sequence;
  (b) receiving NMR RF responses;
  (c) forming respective images representing Chemical Exchange Saturation Transfer (CEST) effects based upon the received NMR RF responses;
  (d) repeating steps (a)-(c) for each of a plurality of MT frequencies within a first range of frequencies;
  (e) displaying, at least one at a time, a plurality of the formed CEST images on a display screen viewable by a user;
  (f) receiving user input identifying at least one of the displayed CEST images as corresponding to a target frequency based upon the MT frequency used to form the identified CEST image;
  (g) generating an enhanced output CEST image based upon a plurality of the formed CEST images acquired using MT frequencies within a specified second MT frequency range including the user-identified target frequency, said second frequency range being smaller than said first frequency range; and
  (h) outputting the enhanced output CEST image.

14. The MRI method according to claim 13, wherein each of the formed CEST images is based upon a respective asymmetric magnetization transfer ratio (MTRasym) determination.

15. The MRI method according to claim 13, wherein displaying a plurality of the formed CEST images on a display screen includes simultaneously displaying the plurality of the formed CEST images on the display screen.

16. The MRI method according to claim 13, wherein generating the enhanced CEST image includes calculating, on a pixel by pixel basis, the enhanced CEST image by at least one of: (1) an average, (2) a sum, or (3) an integral, of said formed CEST images that are in the specified second MT frequency range.

17. The MRI method according to claim 13, wherein the operations further comprise providing a graphical user interface (GUI) having a map display area and one or more user controls, the one or more user controls being controllable by the user to specify one or more of the formed CEST images to be displayed on the GUI.

18. A non-transitory computer readable storage medium having stored therein computer program instructions that, when executed by a processor of a magnetic resonance imaging (MRI) system, causes the processor to perform operations comprising:
  (a) applying, to an imaging volume in a gantry of the MRI system, a sequence of magnetization transfer (MT) pulses and at least one subsequent MR imaging sequence;
  (b) receiving NMR RF responses;
  (c) forming respective images representing Chemical Exchange Saturation Transfer (CEST) effects based upon the received NMR RF responses;
  (d) repeating steps (a)-(c) for each of a plurality of MT frequencies within a first range of frequencies;
  (e) displaying, at least one at a time, a plurality of the formed CEST images on a display screen viewable by a user;
  (f) receiving user input identifying at least one of the displayed CEST images as corresponding to a target frequency based upon the MT frequency used to form the identified CEST image;
  (g) generating an enhanced output CEST image based upon a plurality of the formed CEST images acquired using MT frequencies within a specified second MT frequency range including the user-identified target frequency, said second frequency range being smaller than said first frequency range; and
  (h) outputting the enhanced output CEST image.

* * * * *